US009368987B2

(12) United States Patent
Idzik et al.

(10) Patent No.: US 9,368,987 B2
(45) Date of Patent: Jun. 14, 2016

(54) SOLAR CELL AND PORTABLE ELECTRONIC DEVICE

(71) Applicant: RESEARCH IN MOTION LIMITED, Waterloo (CA)

(72) Inventors: Jacek S. Idzik, Kenilworth (CA); Peter Mankowski, Waterloo (CA); Ryan Alexander Geris, Kitchener (CA)

(73) Assignee: BLACKBERRY LIMITED, Waterloo, Ontario (CA)

( * ) Notice: Subject to any disclaimer, the term of this patent is extended or adjusted under 35 U.S.C. 154(b) by 655 days.

(21) Appl. No.: 13/659,145

(22) Filed: Oct. 24, 2012

(65) Prior Publication Data

US 2014/0111135 A1    Apr. 24, 2014

(51) Int. Cl.
| | |
|---|---|
| *H02J 7/00* | (2006.01) |
| *H02J 7/14* | (2006.01) |
| *H01L 31/02* | (2006.01) |
| *H01L 31/0224* | (2006.01) |
| *H02J 7/34* | (2006.01) |
| *H01M 10/46* | (2006.01) |
| *H02J 7/35* | (2006.01) |

(52) U.S. Cl.
CPC ......... *H02J 7/0052* (2013.01); *H01L 31/02021* (2013.01); *H01L 31/022425* (2013.01); *H02J 7/34* (2013.01); *H01M 10/465* (2013.01); *H02J 7/35* (2013.01); *Y02E 10/50* (2013.01)

(58) Field of Classification Search
USPC ......... 320/101, 107, 108, 115, 103, 114, 116, 320/138; 136/244, 245, 256, 291, 252, 293, 136/206
See application file for complete search history.

(56) References Cited

U.S. PATENT DOCUMENTS

| | | | | |
|---|---|---|---|---|
| 4,228,315 | A * | 10/1980 | Napoli | ........................ 136/256 |
| 6,395,971 | B1 | 5/2002 | Bendel et al. | |
| 6,590,150 | B1 | 7/2003 | Kiefer | |
| 6,608,464 | B1 * | 8/2003 | Lew et al. | ..................... 320/107 |
| 7,551,141 | B1 | 6/2009 | Hadley et al. | |
| 7,799,988 | B2 | 9/2010 | Cutler | |

(Continued)

FOREIGN PATENT DOCUMENTS

| | | |
|---|---|---|
| DE | 42 18 534 A1 | 12/1993 |
| WO | 2011116463 A1 | 9/2011 |
| WO | 2011134512 A1 | 11/2011 |

OTHER PUBLICATIONS

Costia, Daniel Iulian, et al., "Photovoltaic Solar Cell Like Receiver for Electromagnetic Waves in VHF-UHF Bands", Electrical Engineering Faculty, University Politehnica of Bucharest, International Conference on Renewable Energies and Power Quality (ICREPQ'10), Granada, Spain, Mar. 23 to 25, 2010.

(Continued)

*Primary Examiner* — Alexis A Boateng
(74) *Attorney, Agent, or Firm* — Perry + Currier, Inc.

(57) ABSTRACT

A solar cell and a portable electronic device are provided. The solar cell includes a semiconductor material configured to absorb light for generating a current. The solar cell further includes a positive contact and a negative contact. In addition, the negative contact is configured to couple with an external interface. The portable electronic device includes an energy storage unit. The portable electronic device also includes a semiconductor material configured to absorb light for generating a current, a positive contact, and a negative contact. The negative contact of the portable electronic device is configured to couple with an external interface.

9 Claims, 9 Drawing Sheets

(56) References Cited

U.S. PATENT DOCUMENTS

| | | | |
|---|---|---|---|
| 8,115,683 | B1 | 2/2012 | Stefanakos et al. |
| 8,626,250 | B2* | 1/2014 | Won et al. .................... 455/573 |
| 2002/0189663 | A1* | 12/2002 | Nagasawa .................... 136/256 |
| 2003/0121976 | A1* | 7/2003 | Ostergard .................... 235/454 |
| 2007/0087564 | A1* | 4/2007 | Speakman .................... 438/674 |
| 2007/0119496 | A1 | 5/2007 | Baldo et al. |
| 2007/0279002 | A1* | 12/2007 | Partovi .......................... 320/115 |
| 2008/0055177 | A1 | 3/2008 | Dixon |
| 2008/0094025 | A1* | 4/2008 | Rosenblatt et al. .......... 320/101 |
| 2009/0095348 | A1 | 4/2009 | Wegmann |
| 2010/0078230 | A1* | 4/2010 | Rosenblatt et al. ........ 178/18.01 |
| 2010/0095330 | A1 | 4/2010 | Pal |
| 2010/0120473 | A1* | 5/2010 | Oh ............................... 455/566 |
| 2010/0167797 | A1* | 7/2010 | Morichi ......................... 455/572 |
| 2010/0276573 | A1* | 11/2010 | Duerksen .................... 250/208.6 |
| 2011/0050416 | A1* | 3/2011 | Lee ............................... 340/540 |
| 2011/0193519 | A1* | 8/2011 | Alderman .................... 320/101 |
| 2011/0193753 | A1 | 8/2011 | Kim et al. |
| 2012/0026067 | A1 | 2/2012 | Parsche |
| 2012/0153893 | A1* | 6/2012 | Schatz et al. ................. 320/108 |
| 2012/0325283 | A1* | 12/2012 | Robbins ........................ 136/244 |
| 2013/0038268 | A1* | 2/2013 | Markku ......................... 320/101 |
| 2013/0098430 | A1* | 4/2013 | Naskali et al. ................ 136/252 |

OTHER PUBLICATIONS

Corresponding European Patent Application No. 12189843.1 Search Report dated Feb. 1, 2013.

* cited by examiner

SOLAR CELL AND PORTABLE ELECTRONIC DEVICE

FIELD

The present specification relates generally to solar cells and portable electronic devices.

BACKGROUND

The evolution of computers is currently quite active in the portable electronic device environment. As the portable electronic devices increase in functionality, more components are required to be packaged into each portable electronic device leading to greater space requirements within the packaging of the portable electronic device. Each of these components ultimately requires more energy to operate which in turn leads to a decrease in the performance of battery life.

BRIEF DESCRIPTION OF THE DRAWINGS

Reference will now be made, by way of example only, to the accompanying drawings in which.

DETAILED DESCRIPTION OF THE EMBODIMENTS

Figure 1:
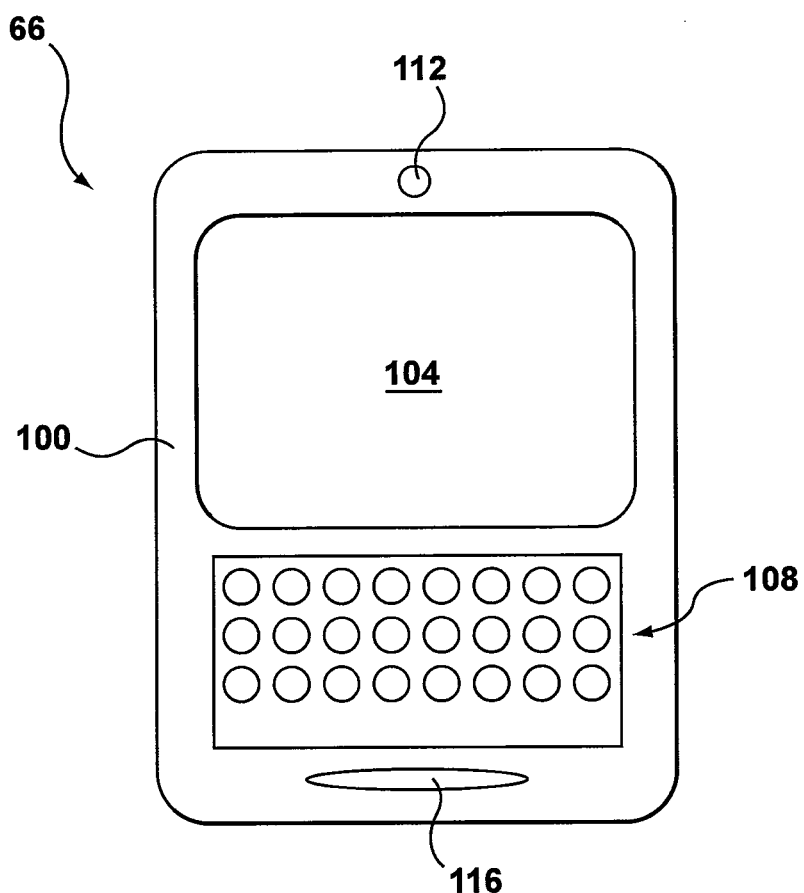
FIG. 1 is a front view of a portable electronic device in accordance with an embodiment.

In accordance with an aspect of the specification, there is provided a solar cell. The solar cell includes a semiconductor material configured to absorb light for generating a current. The semiconductor material includes a positive side and a negative side. The solar cell further includes a positive contact in electrical communication with the positive side. The positive contact is configured to collect current from the positive side. In addition, the solar cell includes a negative contact in electrical communication with the negative side. The negative contact is configured to collect current from the negative side. In addition, the negative contact has a coil geometry for coupling with an external interface.

The coil geometry may be configured for wireless charging.

The coil geometry may be configured for inductive charging.

The negative contact may be electrically connectable to a first circuit and a second circuit. The first circuit may be configured for collecting current from the semiconductor material, and the second circuit may be configured for generating current via induction.

The negative contact may be configured for providing near field communication.

The negative contact may be electrically connectable to a first circuit and a second circuit. The first circuit may be configured for collecting current from the semiconductor material. The second circuit may couple with the external interface to provide near field communication between the negative contact and the external interface.

The solar cell may additionally include an anti-reflection layer disposed on the negative side. The anti-reflection layer may be for decreasing reflective loss of light.

The anti-reflection layer may be disposed over the negative contact to form a protective layer.

In accordance with an aspect of the specification, there is provided a portable electronic device. The portable electronic device includes an energy storage unit configured to provide power to the portable electronic device. The energy storage unit includes a positive terminal and a negative terminal. Furthermore, the portable electronic device includes a semiconductor material configured to absorb light for generating a current. The semiconductor material including a positive side and a negative side. The portable electronic device also includes a positive contact in electrical communication with the positive side. The positive contact is configured to collect current from the positive side and is further configured to be electrically connectable to the positive terminal. Additionally, the portable electronic device includes a negative contact in electrical communication with the negative side. The negative contact is configured to collect current from the negative side and is further configured to be electrically connectable to the negative terminal. Furthermore, the negative contact has a coil geometry for coupling with an external interface.

The coil geometry may be configured for wireless charging.

The coil geometry may be configured for inductive charging.

The portable electronic device may further include a first circuit for electrically connecting the energy storage unit, the positive contact, the negative contact and the semiconductor material. The negative contact may be in electrical communication with the negative terminal. The positive contact may be in electrical communication with the positive terminal. The first circuit may be configured to provide solar charging. The portable electronic device may further include a second circuit for electrically connecting the energy storage unit and the negative contact. A first point of the negative contact may be in electrical communication with the positive terminal and a second point of the negative contact may be in electrical communication the negative terminal. The second circuit may be configured to provide wireless charging. The portable electronic device may further include a switch configured to switch between the first circuit and the second circuit.

The portable electronic device may further include a processor configured to operate the switch.

The processor may be configured to determine an optimal charging method and may automatically operate the switch to provide the optimal charging method.

The negative contact may be configured for providing near field communication.

The portable electronic device may further include a processor configured to communicate with an external device via the external interface. The portable electronic device may further include a first circuit for electrically connecting the energy storage unit, the positive contact, the negative contact and the semiconductor material. The negative contact may be in electrical communication with the negative terminal and the positive contact may be in electrical communication with the positive terminal. The first circuit may be configured to provide solar charging. The portable electronic device may further include a second circuit for electrically connecting the processor and the negative contact. The second circuit may be configured to couple with the external interface to provide near field communication between the negative contact and the external interface. The portable electronic device may further include a switch configured to switch between the first circuit and the second circuit.

The processor may be further configured to operate the switch.

The processor may be configured to automatically operate the switch to provide near field communication when requested and to provide solar charging at other times.

The portable electronic device may further include an anti-reflection layer disposed on the negative side. The anti-reflection layer may be for decreasing reflective loss of light.

The anti-reflection layer may be disposed over the negative contact to form a protective layer.

Referring to FIG. 1, a present embodiment of a computing device 66 is shown. It is to be understood that the computing device 66 is purely exemplary and it will be apparent to those skilled in the art that a wide variety of computing devices are contemplated. For example, variations on the computing device 66 can include, without limitation, a cellular telephone, a portable email paging device, a camera, a portable music player, a portable video player, a personal digital assistant, a portable book reader, a portable video game player, a tablet computer, a netbook computer, or a laptop computer. Other contemplated variations include devices which are not necessarily portable, such as desktop computers. In the present embodiment, the computing device 66 includes a chassis 100 that supports a display 104, a plurality of keys 108, a speaker 112, and a microphone 116.

Figure 2:
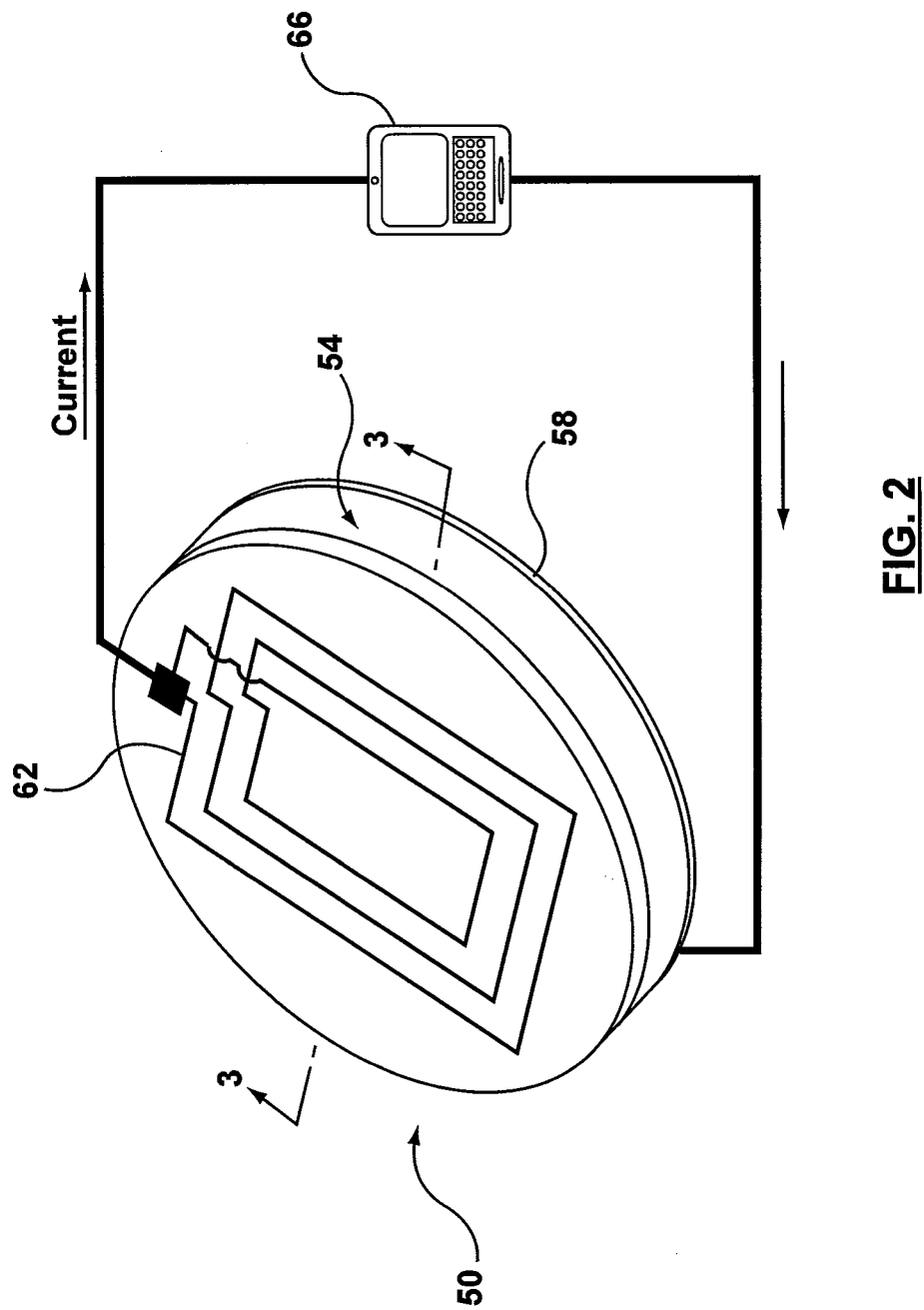
FIG. 2 is a perspective view of a solar cell in accordance with an embodiment.

Referring now to FIG. 2, a schematic representation of a non-limiting example of a solar cell is shown generally at 50. It is to be understood that the solar cell 50 is purely exemplary and it will become apparent to those skilled in the art that a variety of solar cells are contemplated. The solar cell 50 includes a semiconductor material 54, a positive contact 58, and a negative contact 62.

In an embodiment, the solar cell 50 is generally configured to absorb light energy from the surrounding environment and convert it to electrical energy to provide current to a computing device 66. Although the schematic representation shows that the solar cell 50 is separate from the computing device 66, it is to be appreciated that this is a non-limiting embodiment. In other embodiments, the solar cell 50 can be integrated with the housing of the computing device 66 to form a portable electronic device having a solar cell, as discussed in greater detail below. The current provided to the computing device 66 by the solar cell 50 can be used to power the device or to charge an energy storage unit by supplying electrical energy.

Figure 3:
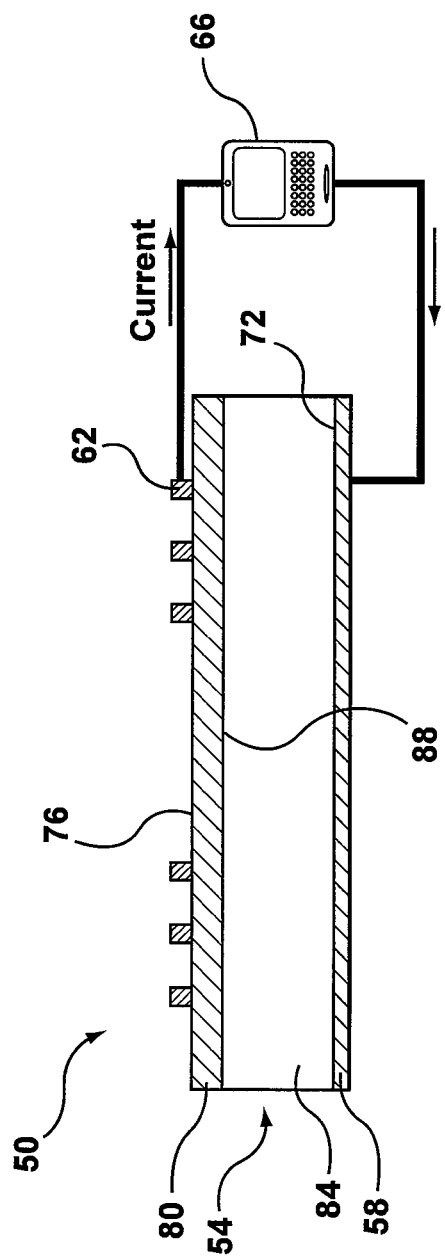
FIG. 3 is a cross section view of the solar cell through the line 3 3 of FIG. 2.

Referring to FIG. 3, a cross section of the solar cell 50 is shown in greater detail. The semiconductor material 54 is generally configured to absorb light for generating a current. The manner by which the semiconductor material 54 absorbs light to generate the current is not particularly limited and can involve using a semiconductor structure having a positive side 72 and a negative side 76. In the present embodiment, the semiconductor material 54 is amorphous silicon. The semiconductor material 54 includes an n-type layer 80 of amorphous silicon and a p-type layer 84 of amorphous silicon. The n-type layer 80 and the p-type layer 84 form a p-n-junction 88 at an interface between the two layers. It is to be understood that the n-type layer 80 includes an n-type semiconductor but is otherwise not particularly limited and that several different techniques of creating the n-type semiconductor of the n-type layer 80 are contemplated. For example, a dopant such as phosphorous can be added as the silicon is grown. Alternatively, other doping techniques such as vapor-phase epitaxy can be used. Furthermore, other dopants capable of acting as donors to provide extra conduction electrons can be use in place of phosphorous. Similarly, it is to be understood that the p-type layer 84 includes a p-type semiconductor but is otherwise not particularly limited and that several different techniques of creating the p-type semiconductor of the p-type layer 84 are contemplated. For example, a dopant such as boron can be added as the silicon is grown. Alternatively, other doping techniques such as vapor-phase epitaxy can also be used. Furthermore, other dopants capable of acting as acceptors to provide extra conduction holes can be use in place of boron.

The positive contact 58 is in electrical communication with the positive side 72 of the semiconductor material 54. The positive contact 58 is generally configured to collect current from the semiconductor material 54 at the positive side 72. It is to be appreciated, with the benefit of this specification, that the positive contact 58 is therefore configured to collect current from the p-type layer 84 in the present embodiment. It is to be understood that the positive contact 58 is not particularly limited to any material and that several different types of conductive materials are contemplated. Examples of materials suitable for collecting current include metals such as gold, copper as well as other materials such as conductive polymers. The manner in which the positive contact 58 is connected to the positive side 72 is also not particularly limited. In the present embodiment, the positive contact 58 is deposited via an evaporation deposition process and uniformly covers the positive side 72. In other embodiments, the positive contact 58 can be modified such that the positive contact may not uniformly cover the positive side 72. In further embodiments, the positive contact 58 can also be modified to be a conductive plate, wire, or plurality of wires connected to the positive side 72 using a conductive adhesive.

The negative contact 62 is in electrical communication with the negative side 76 of the semiconductor material 54. The negative contact 62 is generally configured to collect current from the semiconductor material 54 at the negative side 76. Therefore, it is to be appreciated, with the benefit of this specification, that the negative contact 62 is configured to collect current from the n-type layer 80 in the present embodiment. It is to be understood that the negative contact 62 is not particularly limited to any material and that several different types of conductive materials are contemplated. Examples of materials suitable for collecting current include those discussed above in connection with the positive contact 58. The manner in which the negative contact 58 is connected to the negative side 76 is also not particularly limited. In the present embodiment, the negative contact 62 is deposited via an evaporation deposition process and partially covers the negative side 76. In further embodiments, the negative contact 62 can be modified to be a conductive wire or plurality of wires connected in a predefined pattern to the negative side 76 using a conductive adhesive.

It is to be appreciated, with the benefit of this specification, that since the semiconductor material 54 generates a current when light energy is absorbed, the negative contact 62 allows light to pass through to the semiconductor material 54. In the present embodiment, the negative contact 62 is a metal conductor such as gold. It is to be appreciated that metallic conductors are generally not transparent to light. Therefore, in the present embodiment, the negative contact 62 is patterned on the negative side 76 such that the pattern is sufficiently spaced to allow light to pass through the pattern to be absorbed by the semiconductor material 54. It is to be appreciated that in embodiments where the negative contact 62 is modified to be a transparent conductive polymer, the negative contact 62 can cover more area on the negative side 76 while minimally reducing the amount of light passing through to the semiconductor material 54 where the light energy can be absorbed and converted to current.

Figure 4:
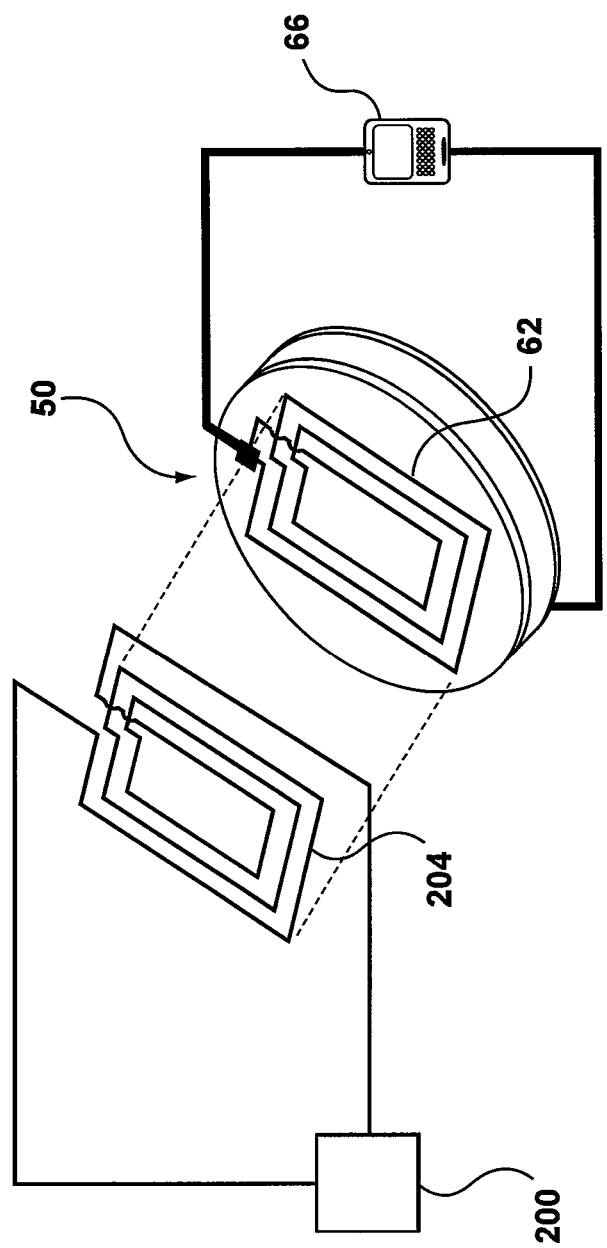

Referring to FIG. 4, the negative contact 62 is generally further configured to couple with an external device 200. It is to be understood that the external device 200 is not particularly limited and can include a wide variety of external devices capable of coupling wirelessly with other devices as discussed in greater detail below with reference to FIGS. 7-9. The geometry of the negative contact 62 is not particularly limited and can include a variety of different geometries dependent on the external device 200. In the present embodiment, the negative contact 62 is disposed on the negative side 76. Furthermore, in the present embodiment, the negative contact 62 is disposed in a coil geometry for coupling with an external interface 204, such as a coil or antenna, of the external device 200. For example, in some embodiments, the negative contact 62 can be configured to inductively couple with the external interface 204. In other embodiments, the negative contact 62 can be configured to function as an antenna to provide communication using radio waves. It will now be appreciated, with the benefit of this description that the exact configuration of the external interface 204 is not particularly limited and can be modified depending on the application and does not necessarily need to have a coil geometry.

In general terms, the solar cell 50 is generally configured to perform two functions for the computing device 66. One function is to generate current from absorbed light energy from the surrounding environment. Another function of the solar cell 50 is to provide wireless coupling between the computing device 66 and the external device 200. It is to be re-emphasized that the solar cell 50 described above is a non-limiting representation only. Notwithstanding the specific example, it is to be understood that other embodiments can be devised to perform the functions of the solar cell 50 as described above. For example, although the present embodiment uses amorphous silicon as the semiconductor material for cost benefits, other embodiments can use polycrystalline or even monocrystalline silicon for applications that would benefit from the semiconductor material 54 having a higher efficiency at converting light energy to electrical energy despite the greater cost. Furthermore, it is to be understood that the semiconductor material 54 is not particularly limited to silicon and that other materials can be used. For example, other suitable materials for the semiconductor material 54 of the solar cell 50 can include cadmium telluride, copper indium selenide, copper indium diselenide, copper indium gallium selenide, gallium arsenic, and organic polymer materials capable of converting light energy to current.

Figure 5:
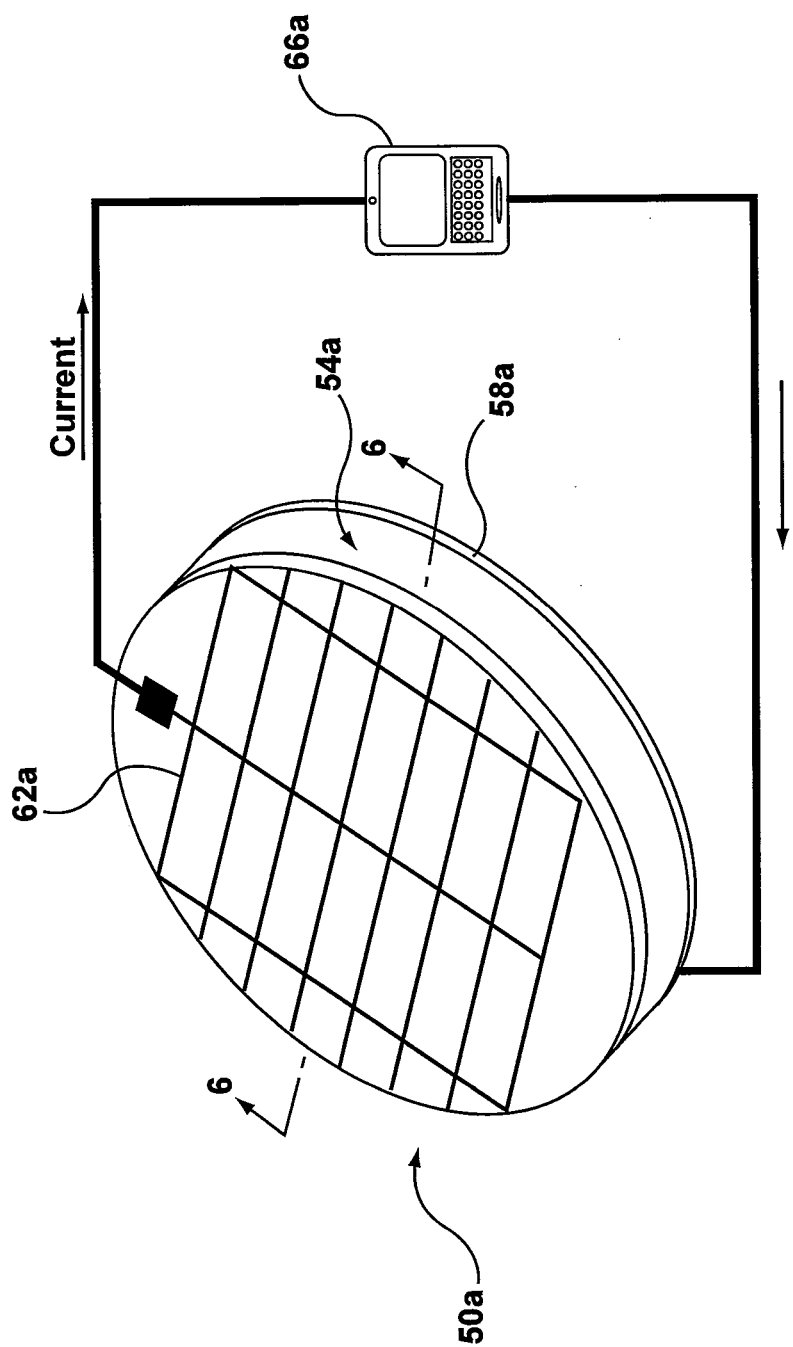
FIG. 5 is a perspective view of a solar cell in accordance with another embodiment.

Referring to FIG. 5, another embodiment of a solar cell 50a is shown. Like components of the solar cell 50a bear like reference to their counterparts in the solar cell 50, except followed by the suffix "a". The solar cell 50a includes a semiconductor material 54a, a positive contact 58a, and a negative contact 62a.

In the present embodiment, the negative contact 62a has a geometry that does not include a coil. Using the geometry shown in FIG. 5, the negative contact 62a can be configured to function as an antenna to send and receive radio signals. The types of radio signals sent and/or received by the negative contact 62a is not particularly limited. For example, the radio signals can include signals for a load modulation type of communication to be received by Wireless Power Consortium (WCP) compliant antenna designs. Therefore, it is to be appreciated by a person of skill in the art, that the negative contact 62 is not limited to any particular shape and that a wide variety of shapes and designs are available for different applications. Indeed, a plurality of different configurations of the negative contact 62 is contemplated herein.

Figure 6:
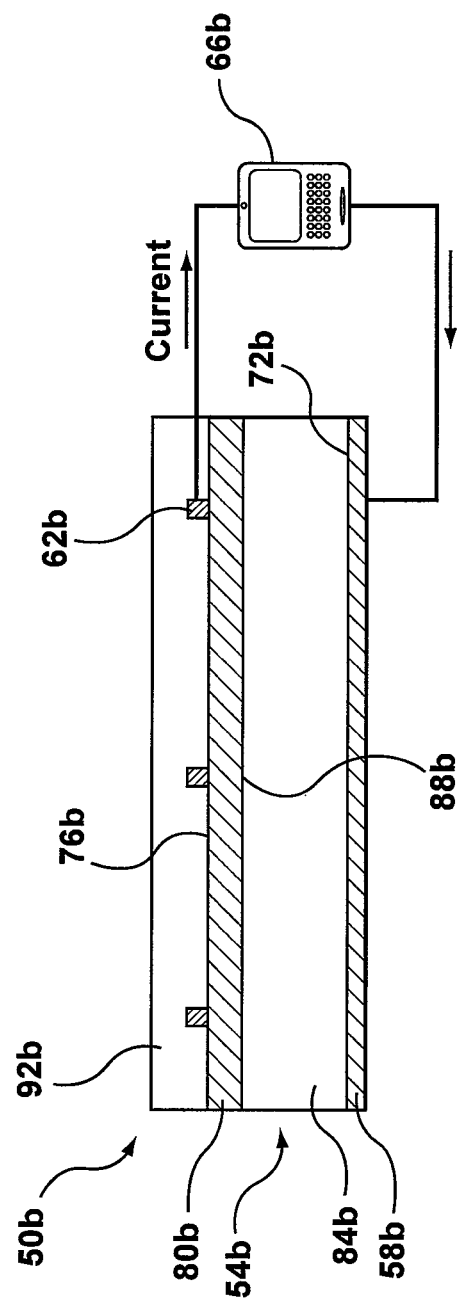
FIG. 6 is a cross section view of the solar cell through the line 6 6 of FIG. 5.

Referring to FIG. 6, another embodiment of a solar cell 50b is shown. Like components of the solar cell 50b bear like reference to their counterparts in the solar cell 50, except followed by the suffix "b". The solar cell 50b includes a semiconductor material 54b, a positive contact 58b, a negative contact 62b, a computing device 66b, a positive side 72b, a negative side 76b, a n-type layer 80b, a p-type layer 84b, and a p-n-junction 88b.

In the present embodiment, the solar cell 50b further includes an anti-reflection layer 92b. The anti-reflection layer 92b is disposed on the negative side 76b of the semiconductor material 54b. The anti-reflection layer 92b is generally configured to decrease the reflective loss of light as light enters the semiconductor material 54b. It is to be appreciated that by decreasing the reflective loss of light, the efficiency of the solar cell 50b is increased because more light will be available to be absorbed by the semiconductor material 54b. The anti-reflection layer 92b is not particularly limited and several different types of anti-reflection layers form from a variety of different methods and techniques are contemplated. For example, the anti-reflection layer 92b can include an index-matching film, a single-layer interference film, a multi-layer interference film, or thin films having nanostructures disposed thereon to reduce reflection of light. Similarly, the material used to form the anti-reflection layer 92b is not particularly limited and can include a wide variety of materials suitable for anti-reflective coatings. For example, the anti-reflection layer 92b can be formed using magnesium fluoride, aluminum oxide, or another suitable dielectric material.

The anti-reflection layer 92b can be further configured to form a protective layer over the negative side 76b. Since the negative side 76b is generally exposed to light so that the semiconductor material 54b can absorb light energy, the semiconductor material 54b can be directly exposed to the external environment. This can subject the negative side 76b to damage as well as attracting contaminants. Damage to the negative side 76b, such as scratches, can result in the scattering of light at the negative side 76b which would lead to a decrease in the amount of light energy reaching the active areas within the semiconductor material 54. To protect against damage to the negative side 76b, the anti-reflection layer 92b can include a material with a greater hardness than the semiconductor material 54b. In addition, the anti-reflection layer 92b can include an antistatic agent to reduce the buildup of contaminants such as dust to protect against a decrease in the effective transparency of the negative side 76b for letting light into the active areas of the semiconductor material 54. For example, antistatic agents can include aliphatic amines, esters, indium tin oxide, or conductive polymers that are transparent.

Figure 7:
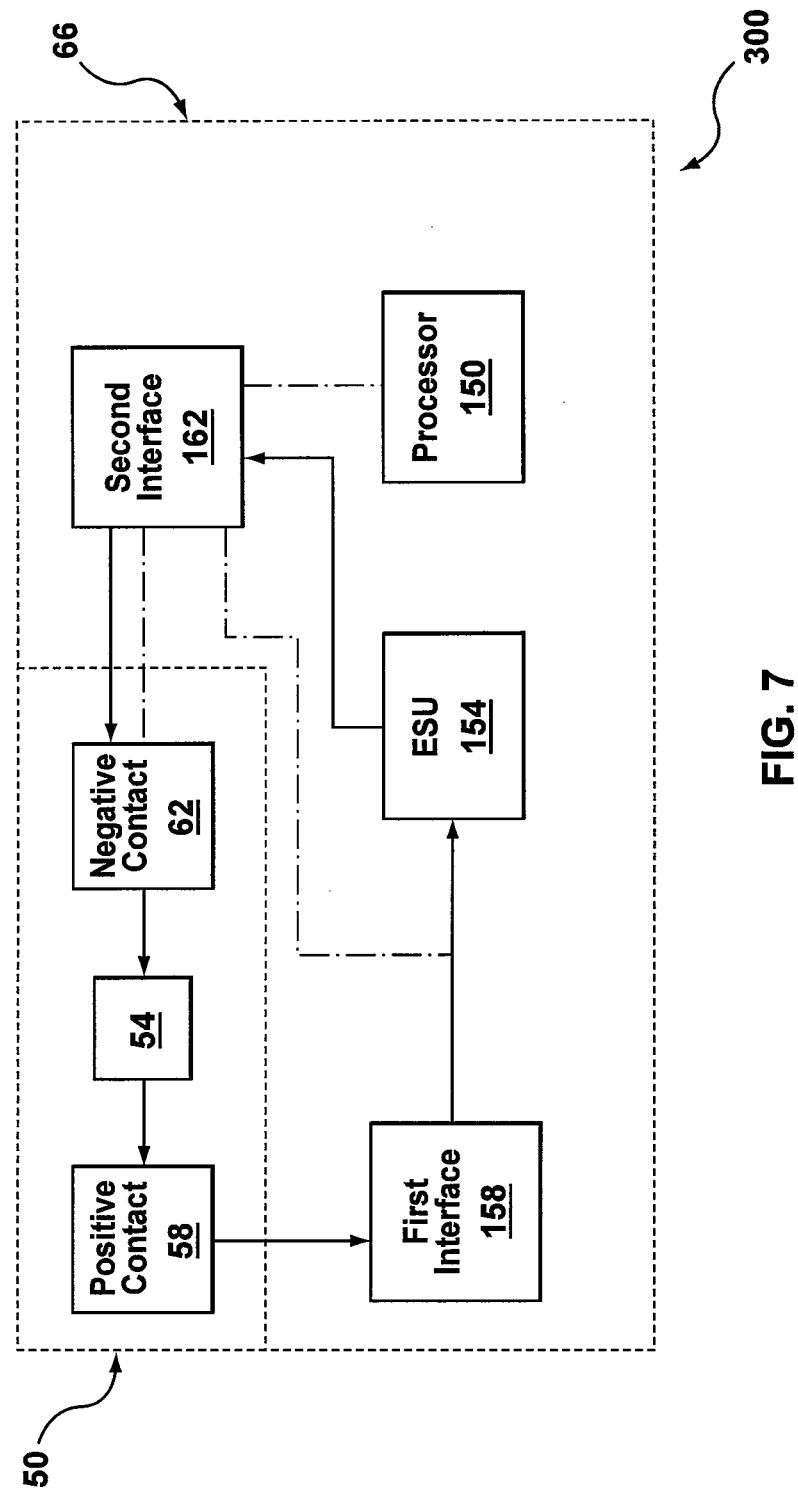
FIG. 7 is a schematic block diagram of a portable electronic device in accordance with an embodiment.
Figure 8:
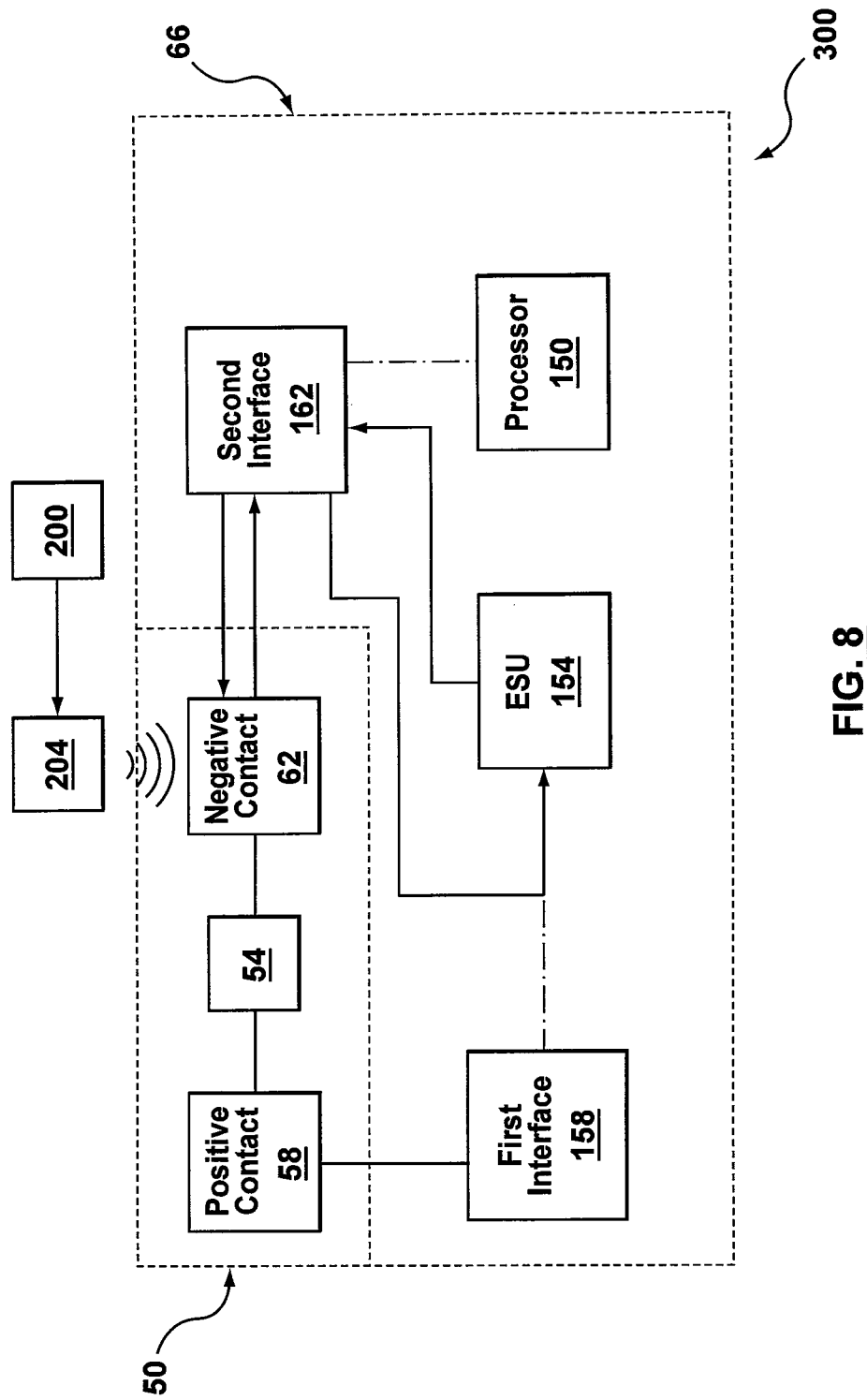
FIG. 8 is a schematic block diagram of a portable electronic device of FIG. 7 coupling with an external device for charging.
Figure 9:
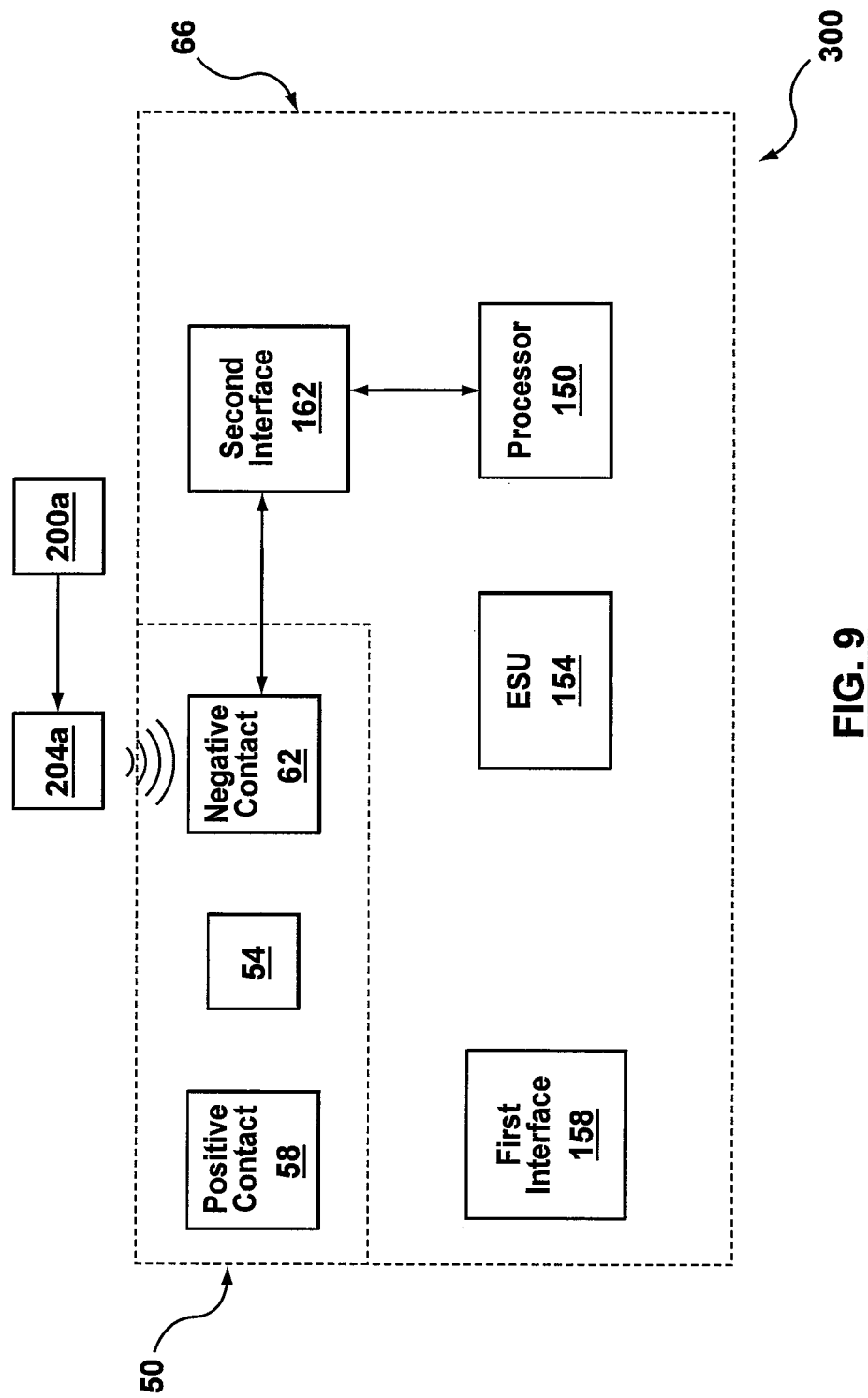
FIG. 9 is a schematic block diagram of a portable electronic device of FIG. 7 coupling with another external device for communication.

Referring to FIGS. 7-9, schematic block diagram of the electronic components of a portable electronic device 300 is shown in operation. It should be emphasized that the structure in FIGS. 7-9 is purely exemplary. In order to assist in the explanation of the portable electronic device 300, it will be assumed that the portable electronic device 300 includes the computing device 66 and the solar cell 50 in a single integral unit. Furthermore, the following discussion of the portable electronic device 300 will lead to further understanding of the solar cell 50 and its various components. However, it is to be understood that the portable electronic device 300, or the solar cell 50 can be varied, and need not work exactly as discussed herein in conjunction with each other, and that such variations are within the scope of the present invention.

The portable electronic device 300 includes a processor 150 for running programming instructions. In general, the programming instructions are stored in a computer readable storage medium (not shown) accessible by the processor 150. The portable electronic device 300 also includes the solar cell 50, and an energy storage unit 154 for storing energy to operate the processor 150.

In general terms, the portable electronic device 300 is generally configured to absorb light energy from the surrounding environment to supply electrical energy to charge the energy storage unit 154 and further configured to allow the computing device 66 to couple with an external device 200, as shown in FIGS. 8 and 9. The energy storage unit 154 is generally configured to store energy to operate the portable electronic device 300. In particular, the energy storage unit 154 generally includes a positive terminal and a negative terminal for providing direct current to a circuit. In the present embodiment, the energy storage unit 154 is configured to provide power to the processor 150 for running the program instructions. The manner by which the energy storage unit 154 stores energy is not particularly limited. For example, in the present embodiment, the energy storage unit 154 is a lithium ion battery. In other embodiments, the energy storage unit 154 can be another type of rechargeable battery or capacitor.

The coupling of the computing device 66 to the external device 200 is not particularly limited and it is to be appreciated that either the energy storage unit 154 or the processor 150 can be directly coupled to the external device 200. For example, the energy storage unit 154 can be coupled to the external device 200 as an alternative method for receiving energy. Alternatively, the processor 150 can couple to the external device 200 to provide communication between the external device 200 and the portable electronic device 300 as will be discussed in greater detail below. It is to be re-emphasized that the portable electronic device 300 described above is a non-limiting representation only. Notwithstanding the specific example, it is to be understood that other embodiments can be devised to perform the functions of the portable electronic device 300 as described above.

FIGS. 7-9 are schematic representations of the portable electronic device 300 in different modes of operation for absorbing light energy from the surrounding environment to charge the energy storage unit 154, as discussed in greater detail below. In the present embodiment, the positive contact 58 is in electrical communication with the computing device 66 via a first interface unit 158 and the negative contact is in electrical communication with the computing device 66 via a second interface unit 162. It is to be re-emphasized that the structure shown in FIG. 7 is a non-limiting representation only. Notwithstanding the specific example, it is to be understood that other equivalent systems can be devised to perform the same function as the present embodiment. For example, it is to be appreciated that in some embodiments, a single interface unit can be used to connect to both the positive contact 58 and the negative contact 62. In other embodiments, the positive contact 58 and the negative contact 62 can be connected directly to processor 150.

In the present embodiment, the first interface unit 158 is generally configured to control the current flow from the positive contact 58 to the energy storage device 154 dependent on the mode of operation. The manner in which the current is controlled is not particularly limited and that various methods are contemplated. In the present embodiment, the first interface unit 158 uses an electronic switch such as a transistor to control the current. In other embodiments, a mechanical switch can be used.

In the present embodiment, the second interface unit 162 is generally configured to control the current between the negative contact 62, the processor 150, and the energy storage device 154 dependent on the mode of operation. The manner in which the current is controlled is not particularly limited and that various methods are contemplated. In the present embodiment, the second interface unit 162 uses an electronic switch such as a transistor to control the flow of current to the different components. In other embodiments, a mechanical switch can be used.

Referring to FIG. 7, the portable electronic device 300 is operating in a first mode for absorbing light energy from the surrounding environment to supply energy to charge the energy storage unit 154. As illustrated, a first circuit is established to collect the current generated by the semiconductor material 54. The arrows in FIG. 7 indicate the flow of current from positive to negative in the present embodiment. The semiconductor material 54 of the solar cell 50 collects light energy from the environment and converts the light energy into current by providing electrons to the negative contact 62 and holes to the positive contact 58. The first circuit connects the positive contact 58 to the positive terminal of the energy storage device 154 via the first interface device 158. The first circuit is completed by connecting the negative terminal of the energy storage unit 154 to the negative contact 62 via the interface unit 162.

It is to be appreciated, with the benefit of this description, that while environmental light is incident on the semiconductor material, the portable electronic device 300 is operated in the first mode illustrated in FIG. 7 to provide additional energy to the energy storage unit 154. Accordingly, this would extend the life of the energy storage unit 154 and reduce the amount of energy required to charge the energy storage unit 154 with power sources such as an household outlet.

Referring to FIG. 8, the portable electronic device 300 is operating in a second mode for inductive coupling with an external device 200 via an external interface 204 to provide wireless charging. In the second mode of operation, the external device 200 is generally configured to be a power source configured to provide an alternating electromagnetic field at the external interface 204. When the negative contact 62 is placed within the changing electromagnetic field of the external interface 204, a voltage would be generated across the negative contact 62. The voltage is collected and transferred to the energy storage unit 154 via the second interface device 162. The manner by which a current is induced is not particularly limited. In the present embodiment, the negative contact 62 has a coil geometry such that the opposite ends of the coil are separately connected to the second interface device 162. The opposite ends of the coil are therefore connected to the opposite terminals of the energy storage unit 154.

It is to be appreciated that a second circuit is provided for wireless charging as shown in FIG. 8. The manner in which the circuit is completed is not limited. For example, in the present embodiment, a wire connects a first point of the negative contact 62 to the positive terminal of the energy storage unit 154 via the second interface device 162. The circuit is completed using a second wire to connect the negative end of the energy storage unit 154 to a second point of the negative contact via the second interface device 162. Alternatively, separate pathways on a printed circuit board can also be used. In further embodiments, a co-axial cable can also be used to complete the circuit.

In general, the external interface 204 is in close proximity to the negative contact 62 during wireless charging such that little if any environmental light would be incident upon the semiconductor material 54. Therefore, in the second mode of the present embodiment, the first interface device 158 opens the circuit to disconnect the positive contact 58 from the energy storage unit 154.

Given the size constraints place on the portable electronic device 300, the solar cell 50 is generally limited in size. In general, due to these constraints, wireless charging provides more power than charging by converting light energy to electric energy by the solar cell 50. Therefore, when the external interface 204 is available, the portable electronic device 300 can be more efficiently charged by operating in the second mode.

It is to be appreciated, that the first interface device 158 and the second interface device 162 are configured to switch between the first mode and the second mode. In the present embodiment, the portable electronic device 300 operates in one of the three modes. However, in other embodiments, such as an embodiment having separate circuitry, the portable electronic device 300 can be modified to operate in more than one mode simultaneously. The manner by which a switch between the first mode and the second mode is initiated is not particularly limited. For example, the switch can be carried out manually via input at the portable electronic device 300. Alternatively, the switch can be automatically carried out under the control of the processor 150. For example, the portable electronic device 300 can be programmed to operate generally in the first mode. The portable electronic device 300 can further include sensors (not shown) to detect when a suitable varying electromagnetic field with which the negative contact 62 can couple is present. When this is detected, the portable electronic device 300 can switch to the second mode automatically. When the varying electromagnetic field is no longer present, the portable electronic device 300 can automatically switch back into the first mode to collect light energy if available. In other embodiments, the processor 150 can be configured to determine an optimal charging method for the energy storage unit and to automatically switch the mode to provide the optimal charging method to the portable electronic device 300. The optimal charging method can be determined based on the power supplied to the energy storage unit 154 between the available methods or on other factors such as potential wear on the hardware components for implementing the available methods of charging.

Referring to FIG. 9, the portable electronic device 300 is operating in a third mode for communicating with an external device 200a via coupling with an external device 200a via an external interface 204a to provide near field communication. In the third mode of operation, the external device 200a is generally configured to be another computing device configured to send and/or receive signals to/from the portable electronic device 300. The external device 200a and the nature of the communication between the portable electronic device 300 and the external device 200a is not particularly limited. For example, in some embodiments, the external device 200a can be a second similar portable electronic device configured to send and receive files on a peer-to-peer basis. In other embodiments, the external device 200a can be a point of sale system where the communication with the portable electronic device 300 is used to facilitate transfer of funds during a purchase. In further embodiments, the communication can also be used to transfer credentials, device information or data files. Indeed, several different types of communications are contemplated herein.

The design of the negative contact 62 for functioning as an antenna is not particularly limited. In the present embodiment, the negative contact 62 has a coil geometry such that the opposite ends of the coil are separately connected to the second interface device 162.

It is to be appreciated that a third circuit is provided for wireless charging as shown in FIG. 9. When operating in the third mode, in the present embodiment, it is to be appreciated that the processor 150 controls the negative contact 62 to receive and send signals with the external device 204a. The manner in which the circuit is completed is not limited and can involve several different antenna designs. In order to send and receive signals using the negative contact 62 as an antenna, the present embodiment includes a tuning element to adjust the impedance of the third circuit. In the present embodiment, the tuning element is built into the second interface device 162. For example, the second interface device can include an adjustable impedance. In other embodiments, the tuning element may be a separate component or built into the processor 150. In further embodiments, a tuning element can be omitted where the third circuit does not need to be tuned after manufacturing.

Similar to the second mode of operation, the external interface 204a is generally in close proximity to the negative contact 62 for near field communication such that little if any environmental light would be incident upon the semiconductor material 54. Therefore, in the third mode of the present embodiment, the first interface device 158 opens the circuit to disconnect the positive contact 58 from the energy storage unit 154 and the second interface device 162 opens the circuit path between the second interface device 162 and the energy storage unit 154.

In general, communicating with the external device 200a uses energy from the energy storage unit. Therefore, in the present embodiment, the third mode of operation is generally implemented when communicating with the external device 200a. When communication with the external device 200a is not occurring, the portable electronic device can be more efficiently operated in the first or second mode as described above.

It is to be appreciated, that the first interface device 158 and the second interface device 162 are configured to switch to and from the third mode. The manner by which a switch to and from the third mode is initiated is not particularly limited. For example, the switch can be carried out manually via input at the portable electronic device 300 when near field communication is desired. Alternatively, the switching can be automatically carried out by the processor 150. For example, the portable electronic device 300 can include near field communication sensors (not shown) to detect when an external near field communication coil 204a is within range of the negative contact 62. When this condition is detected, the portable electronic device 300 can switch to the third mode automatically. When the external interface 204a is moved out of range, the portable electronic device 300 can automatically switch out of the third mode to attempt charging the energy storage unit 154.

In general terms, the portable electronic device 300 is generally configured to operating in one of at least different modes using different circuits. In the first mode, the portable electronic device 300 uses a solar cell 50 to absorb light energy from the surrounding environment. In the second mode, the portable electronic device 300 couples with an external device 200 or 204a. It is to be re-emphasized that the portable electronic device 300 described above is a non-limiting representation only. Notwithstanding the specific example, it is to be understood that other embodiments can be devised to perform the functions of the portable electronic device 300 as described above. For example, although the present embodiment is capable of operating in three different modes, other embodiments can operate in either the first and second modes or the first and third modes. Furthermore, it is to be understood that in other embodiments, the first interface device 158 can be omitted if the high resistance of the semiconductor material 54 when no environmental light is incident on the semiconductor material 54 is relied upon to open the first circuit.

It is to be understood that variations of the solar cell and portable electronic device described above are contemplated. As a non-limiting example, although only inductive wireless charging is described above, other types of wireless charging techniques are contemplated such as magnetic resonance and capacitive charging. As another example, although only near field communication is described above, other types of communications are contemplated such as BLUETOOTH or Wireless Local Area Network communications. As another example, although the embodiments show that the energy storage unit 154 supplies power to the processor 150, it is also contemplated that the portable electronic device 300 can be modified such that the solar cell 50 can provide power directly to the processor 150 when the solar cell 50 generates sufficient power.

Various advantages will now be apparent. Of note is the ability to charge the energy storage unit 154 of a portable electronic device 300 at every opportunity using the solar cell 50. By charging the energy storage unit 154 as often as possible, the effective life of the energy storage unit 154 is extended and less power consumption from conventional sources such as a typical outlet will be required to operate the portable electronic device. In addition, by configuring the negative contact 62 to perform an additional function, fewer components would be required in the portable electronic device 300 resulting in a more compact package.

While specific embodiments have been described and illustrated, such embodiments should be considered illustrative only and should not serve to limit the accompanying claims.

What is claimed is:

1. A solar cell comprising:
a semiconductor material configured to absorb light for generating a current, the semiconductor material having a positive side and a negative side, the positive side comprising an inward facing side and the negative comprising an outward facing side;
a positive contact in electrical communication with the positive side, the positive contact configured to collect a light induced current from the positive side; and
a negative contact in electrical communication with the negative side, and located on the outward facing side, the negative contact configured to collect the light induced current from the negative side, the negative contact having a coil geometry configured to couple with an external power charging interface to generate inductive current in the negative contact, and an external near field communication device to receive data therefrom, the positive contact and the negative contact further configured to connect with an energy storage unit to convey the light induced current there to, and the negative contact further configured to: connect to the energy storage unit independent of the positive contact to convey the induction current thereto; and communicate the data received from the external near field communication device to a data processing device.

2. The solar cell of claim 1, further comprising an anti-reflection layer disposed on the negative side, the anti-reflection layer for decreasing reflective loss of light.

3. The solar cell of claim 2, wherein the anti-reflection layer is disposed over the negative contact to form a protective layer.

4. A portable electronic device comprising:
a data processing device;
an energy storage unit configured to provide power to the portable electronic device, the energy storage unit having a positive terminal and a negative terminal;
a semiconductor material configured to absorb light for generating a current, the semiconductor material having a positive side and a negative side, the positive side comprising an inward facing side and the negative comprising an outward facing side;
a positive contact in electrical communication with the positive side, the positive contact configured to collect a light induced current from the positive side and further configured to be electrically connectable to the positive terminal; and
a negative contact in electrical communication with the negative side, and located on the outward facing side, the negative contact configured to collect the light induced current from the negative side and further configured to be electrically connectable to the negative terminal, the negative contact having a coil geometry configured to couple with an external power charging interface to generate inductive current in the negative contact, and an external near field communication device to receive data therefrom, the positive contact and the negative contact further configured to connect with an energy storage unit to convey the light induced current there to, and the negative contact further configured to: connect to the energy storage unit independent of the positive contact to convey the induction current thereto; and communicate the data received from the external near field communication device to the data processing device.

5. The portable electronic device of claim 4, further comprising:
one or more switches configured to: in a light charging mode, connect the positive contact and the negative contact to the energy storage unit: and, in an induction charging mode, disconnect the positive contact from the energy storage unit and connect the negative contact to the energy storage unit: and in a data connection mode, disconnect the positive contact and the negative contact from the energy storage unit, and connect the negative contact to the data processing device.

6. The portable electronic device of claim 5, further comprising a processor configured to operate the one or more switches.

7. The portable electronic device of claim 6, wherein the processor is configured to determine an optimal charging method and automatically operate the one or more switches to provide the optimal charging method.

8. The portable electronic device of claim 4, further comprising an anti-reflection layer disposed on the negative side, the anti-reflection layer for decreasing reflective loss of light.

9. The portable electronic device of claim 8, wherein the anti-reflection layer is disposed over the negative contact to form a protective layer.

* * * * *